United States Patent
Murakowski et al.

(10) Patent No.: US 7,384,724 B2
(45) Date of Patent: Jun. 10, 2008

(54) METHOD FOR FABRICATING OPTICAL DEVICES IN PHOTONIC CRYSTAL STRUCTURES

(75) Inventors: Janusz Murakowski, Newark, DE (US); Dennis W. Prather, Newark, DE (US)

(73) Assignee: University of Delaware, Newark, DE (US)

( * ) Notice: Subject to any disclaimer, the term of this patent is extended or adjusted under 35 U.S.C. 154(b) by 323 days.

(21) Appl. No.: 10/525,763

(22) PCT Filed: Aug. 26, 2003

(86) PCT No.: PCT/US03/26499

§ 371 (c)(1),
(2), (4) Date: Aug. 25, 2005

(87) PCT Pub. No.: WO2004/019080

PCT Pub. Date: Mar. 4, 2004

(65) Prior Publication Data

US 2006/0099534 A1    May 11, 2006

Related U.S. Application Data

(60) Provisional application No. 60/405,709, filed on Aug. 26, 2002.

(51) Int. Cl.
*G03C 5/00* (2006.01)
*G03H 1/02* (2006.01)

(52) U.S. Cl. .................... 430/296; 430/2; 430/312; 430/319; 430/321; 430/394; 430/942; 359/3

(58) Field of Classification Search .................... 430/2, 430/296, 312, 319, 321, 394, 942; 359/3
See application file for complete search history.

(56) References Cited

U.S. PATENT DOCUMENTS

| | | | |
|---|---|---|---|
| 4,403,151 A | 9/1983 | Mochiji et al. | |
| 4,517,280 A | 5/1985 | Okamoto et al. | |
| 7,255,804 B2 | 8/2007 | Prather et al. | |
| 2002/0074307 A1 | 6/2002 | Cotteverte et al. | |

FOREIGN PATENT DOCUMENTS

| EP | 0964305 | 12/1999 |
|---|---|---|
| EP | 0997994 | 5/2000 |
| JP | 59-009920 | 1/1984 |
| JP | 62-267740 | 11/1987 |
| JP | 03-040481 | 2/1991 |
| JP | 06-283813 | 10/1994 |

OTHER PUBLICATIONS

M. Campbell et al., "Fabrication of Photonic Crystals for the Visible Spectrum by Holographic Lithography", Nature, vol. 404, Mar. 2000, pp. 53-56.
A.J. Turberfield, "Photonic Crystals Made by Holographic Lithography", MRS Bulletin, Aug. 2001, pp. 632-636.
B.J. Lin, "Combined Optical and Electron-Beam to Produce 50-Nanometer Integrated Circuit Patterns", IBM Tec. Discl., vol. 19, No. 7, Dec. 1976, pp. 2779-2782.
Cheng, Chuan C. et al., "New Fabrication Techniques for High Quality Photonic Crystals," J. Vac. Sci. Technology B., 15(6), Nov./Dec. 1997, pp. 2764-2767.
Schneider, Garrett J. et al., "Combination Lithography for Photonic-Crystal Circuits," J. Vac. Sci. Technology B., 22(1), Jan./Feb. 2004, pp. 146-151.
Murakowski, Janusz et al., "Combination Lithography for Photonic Crystal Circuits," Proceedings of SPIE, 5000, Jul. 2003, pp. 1-8.
US RE35,930, 10/1998, Brueck et al. (withdrawn)

*Primary Examiner*—Christopher G. Young
(74) *Attorney, Agent, or Firm*—Ratner Prestia

(57) ABSTRACT

A method for manufacturing optical components in a three-dimensional photonic crystal lattice. A first resist (9) is coated on a substrate (10) and exposed to an e-beam (11), to produce an imaged area (12). Another resist coating is applied to thicken the resist (13) and an interference exposure (15) is used to image the result. This is developed to form periodic voids (16), which may be filled with a materials having a high refractive index to form a pattern (18 and 12) when the resist (13) is removed.

14 Claims, 3 Drawing Sheets

METHOD FOR FABRICATING OPTICAL DEVICES IN PHOTONIC CRYSTAL STRUCTURES

BACKGROUND OF THE INVENTION

The present invention relates to integrated optical circuits, which are fabricated in a photonic crystal. Specifically, a method is disclosed which creates optical devices in a photonic crystal structure using both electron beam (e-beam) and optical exposure of a resist to define an optical device surrounded by a dielectric periodic structure, a photonic crystal.

Optical circuits may be fabricated in photonic crystals, which consists of optical devices surrounded by a dielectric periodic structure exhibiting a photonic bandgap. The photonic bandgap is a range of frequencies which will not propagate through the periodic structure. The parameters of the dielectric periodic structure include the period length, refractive index of the structure, the shape of the periodic lattice as well as other factors, which determine the frequency of light that cannot propagate within the periodic structure. Light having a frequency within the photonic bandgap of the dielectric periodic structure is confined in the optical device, such as a waveguide, which constitutes a defect in the periodicity, and its further propagation is controlled by the optical device.

Processes for manufacturing such integrated optical circuits are disclosed in a published U.S. patent application (U.S. 2002/0074307A1), as well as other references. The dielectric periodic structures are formed within the dielectric layer, and an optical device such as a waveguide is formed by creating a longitudinal interruption in the periodic structure. Light having a frequency within the corresponding bandgap of the material is reflected along the internal surfaces of the longitudinal structure.

Another way of utilizing photonic crystal for waveguiding is by engineering its dispersion properties so that light is forced to propagate only along certain discrete number of directions. In this case, for arbitrary light routing, defects in the form of mirrors can be used to redirect the propagation of light from one allowed direction to another.

In either case, the usefulness of a device based on photonic crystals rests on the ability to create defects in the regular periodic array of the photonic crystal.

The creation of the periodic dielectric structure and optical components within the periodic structure typically requires the use of photo masks to define features in the integrated circuit corresponding to the periodic dielectric structure and the optical components. The use of photo masks is a significant cost factor in the manufacturing of such integrated circuits. Moreover, the creation of three-dimensional structures with devices embedded in the photonic crystal matrix requires a multilayer fabrication. In this case a working device is possible only with very precise alignment between layers, which is both costly and time consuming.

Other techniques for creating the periodic dielectric structure includes the use of optical interferometric lithography, which is useful for exposing large areas of a dielectric surface, and for creating a three-dimensional periodic dielectric structure. The process eliminates the need for a photo mask, however, not all sizes and configurations of an optical device can be formed within the periodic dielectric structure using interferometric lithography exclusively. In particular, the placement of defects, such as waveguides, resonators, or mirrors, is impractical with interferometric lithography alone.

Electron beam (e-beam) technology permits the creation of very high resolution patterning on a substrate. E-beam exposure also permits a well determined penetration depth to be obtained within a layer of resist used to form patterns of circuit components on a substrate. However, patterning large surface areas using e-beam exposure is relatively slow. Moreover, the creation of 3D patterns requires multilayer processing with all the drawbacks listed above.

It is an object of the present invention to combine optical interferometric lithography for exposing large areas of resist to create a three-dimensional periodic structure with e-beam exposure techniques to manufacture optical circuits embedded in the three-dimensional periodic structure.

BRIEF SUMMARY OF THE INVENTION

A process is provided for manufacturing three-dimensional photonic crystals using both optical exposure techniques as well as electron beam exposure techniques. The optical exposure techniques are used interferometrically on a resist material to define three-dimensional periodic structures. Additionally, the resist material is electron beam sensitive. Using e-beam exposure techniques, the e-beam penetration depth in the resist is controlled, and three-dimensional components may be defined within the resist material having the required three-dimensional geometry. As a result of using both exposure methods, large regions of the photo resist may be exposed using optical exposure to define three-dimensional periodic structures, and smaller regions constituting component features may be defined using the e-beam exposure process.

In accordance with a preferred embodiment of the invention, the substrate is covered with a resist material, which is also sensitive to electron beam radiation, and component structures are patterned in the resist by e-beam exposure. Following the formation of these patterns representing the three-dimensional optical components, a second layer of the resist is deposited. The resist is then exposed to coherent radiation using a volumetric interference pattern of multiple coherent beams of radiation.

The exposed resist is then chemically developed. For resists having positive contrast for optical radiation and negative contrast to electron beam, such as AZ5214, areas which were exposed to light from the interference pattern and unexposed by the electron beam are removed. The result is a pattern consisting of a regular grid of holes, corresponding to antinodes formed by the interference pattern, as well as the component features representing defects in the interference pattern which were created by the e-beam. In order to increase the dielectric contrast, the holes are back-filled with a high refractive index material, creating a three-dimensional dielectric contrast which is periodic, surrounding components formed from patterns created using the e-beam. The remaining resist is chemically dissolved resulting in a three-dimensional periodic structure with a high dielectric contrast, which includes an optical component.

DETAILED DESCRIPTION OF THE PREFERRED EMBODIMENT

Figure 1:
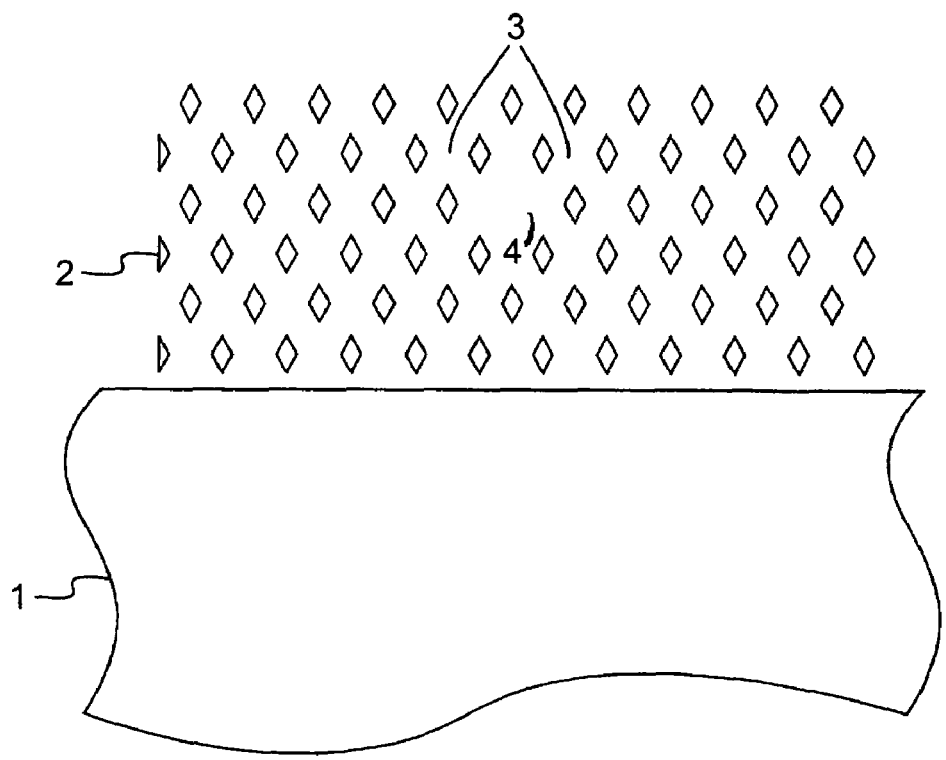
FIG. 1 illustrates a sectional view of an optical integrated circuit of photonic material having a waveguide.

Referring now to FIG. 1, a sectional view of a three-dimensional photonic crystal with an embedded waveguide 4 is shown. A substrate 1 is coated with a dielectric 2, and a plurality of holes 3 in the dielectric layer 2 create a three-dimensional periodic structure which confines light to propagate along waveguide 4 due to the dielectric contrast presented by the holes 3 in all directions. An optical component such as a waveguide 4 for light having frequencies within the bandgap is formed by creating a defect in the periodic structure in the dielectric 2. The light is confined in all directions within the waveguide as it is guided along the inner surfaces of the waveguide structure.

The present invention makes use of two distinctly different processes for patterning features in the dielectric 2. In the preferred embodiment, the process uses a resist material which has a positive photo resist characteristic when subject to optical exposure, and which has a negative resist characteristic when exposed to an electron beam (e-beam). Optical components such as waveguides, cavities, resonators, switches, etc. may be precisely patterned in the resist using the controllable e-beam to expose the resist. Subsequent layers of resist may thereafter be applied to the surface, and the resist is subject to an optical exposure to create the surrounding 3-dimensional periodic structure.

Figure 2:
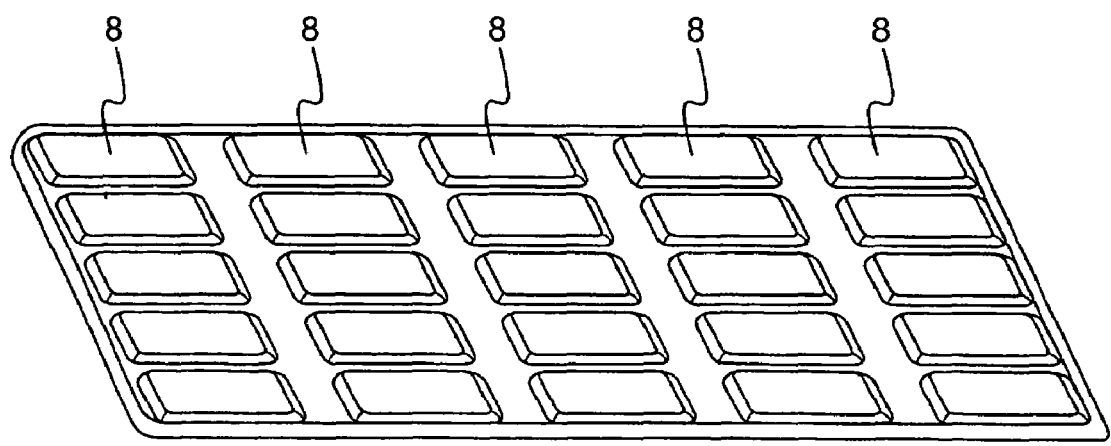
FIG. 2 is a micrograph of a substrate having a resist coating exposed with an electron beam.

Surface features produced from patterns produced by e-beam exposure are shown in the micrograph of FIG. 2. A plurality of 25 pads 8 are created by exposing the area of pads 8 on a photo resist such as AZ5214 with the e-beam. The photo resist has a positive resist characteristic to UV exposure, but exhibits a negative resist characteristic to e-beam exposure. Following the step of exposing pads 8 to the e-beam, the entire surface is exposed to ultraviolet radiation (UV). The photo resist is then developed using, for instance, an MIF327 developer. Pads 8 which were exposed by the e-beam are not dissolved by the developer as a result of the resist having a negative e-beam characteristic.

Figure 3A:
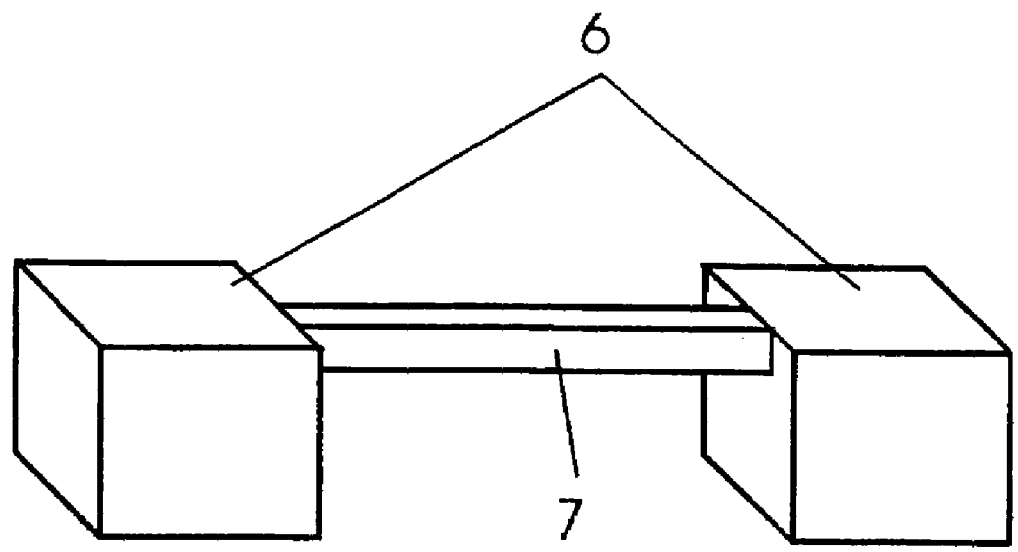
FIG. 3A illustrates the result of variable kV electron beam exposure of a resist coating on a substrate.

FIG. 3A illustrates the effect of the e-beam accelerating potential on the resist. Supporting structures 6 in the resist are produced by selectively irradiating the surface using an e-beam having an accelerating potential of 20 kV, and connecting bridges 7 are formed by irradiating the area between the supporting structures 6 with an e-beam accelerating potential of 5 kV. After the e-beam exposure, the entire surface is flooded with UV radiation. Following developing of the exposed surface, the remaining resist thickness in the connecting bridges 7 have a thickness which is established by the accelerating potential of the e-beam used to expose them. As 20 kV electrons penetrate and expose the full thickness of the resist, the height of supporting structures is determined by the original resist thickness.

Figure 3B:
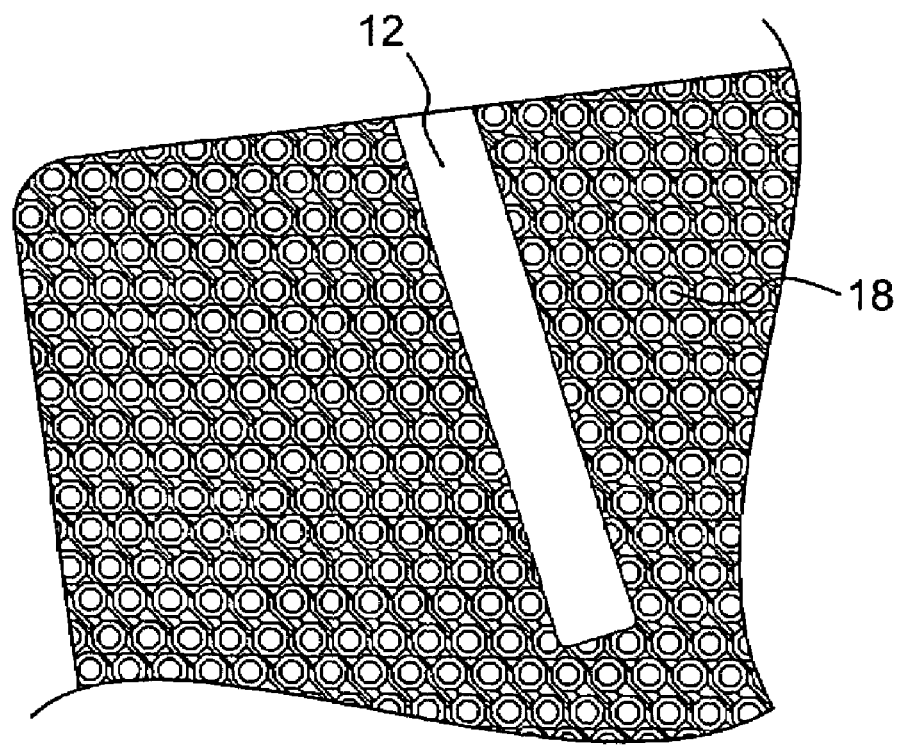
FIG. 3B illustrates a plan view image of a periodic array structure having two-dimensional periodicity and a waveguide.

FIG. 3B illustrates the results of combining e-beam exposure techniques with UV exposure techniques. The defect 12 represents a waveguide structure in the periodic structure 18 containing a plurality of holes generated by exposure to ultraviolet (UV) radiation. The holes are uniform across a 200 μm square. The waveguide structure 12 results from the e-beam exposure which protects the region from the subsequent UV exposure steps. The e-beam process has made it possible to selectively desensitize the resist so that the defect 12 or interruption may be formed in the periodic structure 18.

Figure 4A:
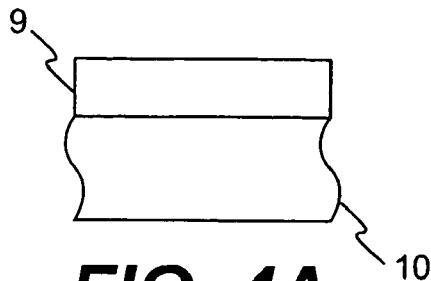
FIG. 4A illustrates the step of coating a substrate with a resist.
Figure 4E:
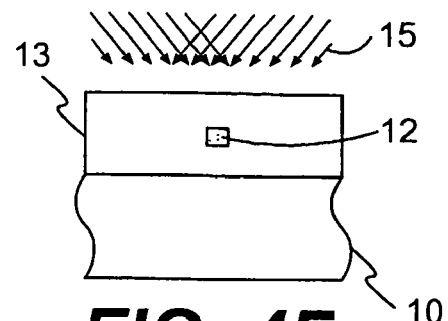
FIG. 4E illustrates the process of interferometric exposure for creating a pattern of a periodic dielectric structure in the resist.
Figure 4B:
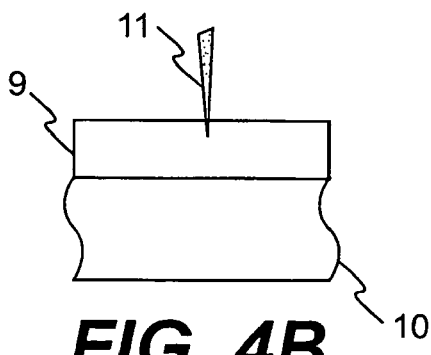
FIG. 4B illustrates the step of exposing the resist with an e-beam to pattern a three-dimensional component.

The e-beam process is used in combination with the UV process to form optical components as well as the 3-dimensional periodic structure by employing the process steps of FIGS. 4A-4H. The first step of the process shown in FIG. 4A is to coat the substrate 10 with a layer of the resist material 9 which has a UV positive resist characteristic and an e-beam negative resist characteristic. FIG. 4A shows the results of spinning a liquid solution of the AZ5214 resist material 9 on the substrate 10 in a liquid solution, and then evaporating the solvent of the solution. FIG. 4B illustrates the step of using a controlled e-beam 11 to create a pattern representing an optical component such as a waveguide in 3-dimensions in the resist material 9. Depending on the accelerating voltage of the e-beam electrons exposing the resist 9, the penetration depth in the resist is controlled so that a defect is created having the desired 3-dimensional geometry. Thus, planar dimensions in the surface of the resist 9 are controlled as well as the depth or height of the resulting exposed area to create the pattern 12 of an optical component such as a waveguide in predefined 3-dimensions.

Figure 4F:
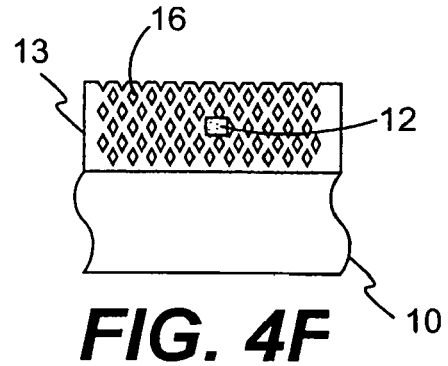
FIG. 4F illustrates the process of developing the exposed resist.
Figure 4C:
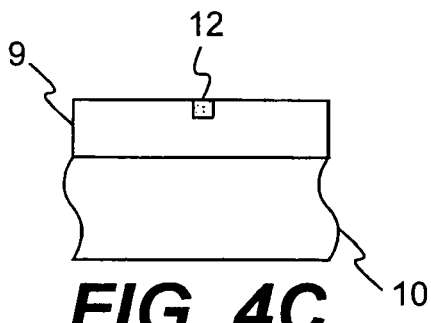
FIG. 4C illustrates the component pattern created by exposing the resist with an e-beam.
Figure 4G:
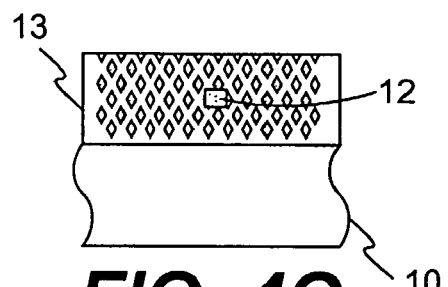
FIG. 4G illustrates back filling of voids created by the interfering light beams with a high dielectric material.
Figure 4D:
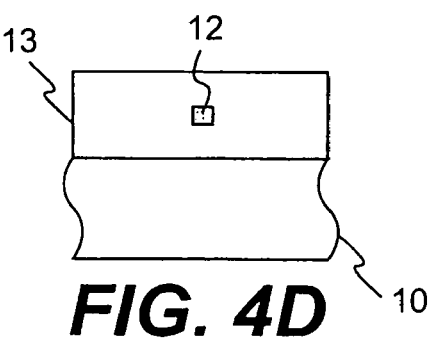
FIG. 4D illustrates the step of forming a second layer of resist on the substrate.

Once the pattern 12 has been created by the e-beam for the optical component, where the e-beam exposed areas are desensitizes as shown in FIG. 4C, another layer of resist 13 is deposited as shown in FIG. 4D.

Now that the pattern for the optical component has been created by the e-beam, the entire photonic crystal can be exposed using interferometric UV exposure as shown in FIG. 4E. The entire volume of resist comprising newly deposited layer of resist 13 and resist layer 9 is exposed by a plurality of coherent beams 15 to form a pattern, which contains exposed and unexposed areas resulting from the interference pattern produced by the sources of radiation.

The exposed resist material 13 is then chemically developed by dissolving the areas which had been exposed to light (antinodes of the interference pattern) and unexposed to the electron beam as shown in FIG. 4F using a developer such as MIF327. This results in the series of regular voids or holes 16 forming a grid which corresponds to the antinodes of the interference pattern.

The voids 16 created in the resist layer are filled as shown in FIG. 4G with a high refractive index material such as silicon. The high refractive index material results in a periodic structure 18 having a high dielectric contrast which is periodic in 3-dimensions.

Figure 4H:
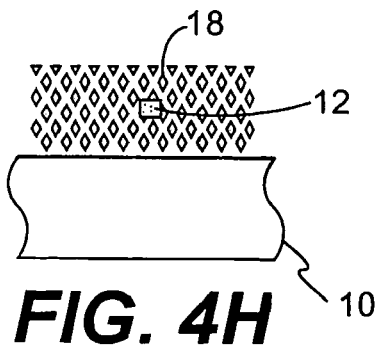
FIG. 4H illustrates the step of dissolving the resist creating a lattice of dielectric surrounding a waveguide structure.

The resist is then dissolved in a process step shown in FIG. 4H. The 3-dimensional periodic structure 18 exists everywhere except in 12 where the e-beam had originally exposed the resist.

Thus, there has been described a process for creating integrated circuit components embedded in a three-dimensional photonic crystal matrix.

While the description above contains many specifics, they should be deemed for illustration only. Many modifications can be made by those skilled in art that are within the spirit of the invention. In particular, it is obvious that the resist, AZ5214, can be replaced by a number of others. The only requirement on the resist is that it is sensitive to both optical radiation and electron beam radiation. Whether the resist exhibits positive or negative contrast to either radiation is also immaterial as long as areas exposed to e-beam are sufficiently modified before the subsequent optical exposure so as to produce defects in the regular lattice formed by nodes and antinodes of the interferometric exposure. In addition, the number of layers is not limited to two, but can be extended as desired for a particular application. Moreover, since the substrate is only for mechanical support, its presence is optional as long as there exist other means of mechanical support. Therefore the description above should not be construed as limiting the scope of the invention, which is determined by the appended claims.

What is claimed as new and desired to be protected by Letters Patent of the United States is:

1. A process for forming optical integrated circuits comprising:
   depositing a resist layer on a substrate having a positive resist characteristic to optical radiation and negative resist characteristic to an electron beam;
   forming optical structures in said resist by selectively exposing said resist with and electron beam; and
   forming a periodic structure outside of said optical structures which exhibits a photonic bandgap.

2. The process for forming optical integrated circuits according to claim 1, wherein said periodic structure is formed by:
   exposing said resist with an interference pattern of optical radiation, filling voids created in said interference pattern with a dielectric material; and
   removing said resist material to create a periodic structure having a photonic bandwidth.

3. The process for forming optical integrated circuits according to claim 1, wherein said optical structures are three dimensional with one of said dimensions being controlled by selecting a predetermined electron beam potential.

4. The process for forming optical integrated circuits according to claim 3, wherein said electron beam potential is selected to 0.5-20 kV.

5. The process for forming optical integrated circuits according to claim 1, wherein said optical structure is a waveguide.

6. A process for forming optical integrated circuits comprising:
   depositing a first resist which has a positive resist characteristic to ultraviolet light and a negative resist characteristic to an electron beam on a substrate;
   creating a pattern for defining an optical component on said resist by exposing said resist with an electron beam having an accelerating potential selected to control one dimension of said component;
   depositing a second layer of resist on said first resist layer following exposure of said first layer of resist by said electron beam;
   exposing said layers of resist with multiple interfering light beams forming an interference pattern in the resist layers;
   developing said layers of resist to create voids in locations exposed by said interfering light beams;
   backfilling said voids with a material having a high index of refraction; and
   dissolving said resist to produce a three dimensional periodic dielectric with a high index of refraction contrast.

7. The process for forming an optical integrated circuit according to claim 6, wherein said optical component is a waveguide.

8. The process for forming an optical integrated circuit according to claim 7, wherein resist is patterned using said electron beam to form one of an optical cavity resonator or switch.

9. A method for creating a latent image of a periodic structure with embedded defects comprising:
   preparing a first layer of resist, said resist being sensitive to both optical radiation and electron beam radiation;
   selectively exposing said first layer of resist with an electron beam in an imagewise fashion, where the electrons of said electron beam move at a velocity required to penetrate only a predefined thickness of the outmost regions of said layer of resist;
   depositing a second layer of resist sensitive to optical radiation;
   exposing the resist multilayer to a plurality of coherent beams of optical radiation that form an array of nodes and antinodes corresponding to an interference pattern in the volume of said resist multilayer;
   whereby said latent image of a periodic structure is formed in the volume of the resist multilayer created by said array of nodes and antinodes, which also contains said embedded defects created by said electron beam radiation.

10. A method of claim 9, where said layer of resist is prepared by depositing its liquid form on a substrate and evaporating a solvent.

11. A method of claim 9, where said resist has a negative contrast for said electron beam exposure.

12. A method for creating periodic structure with embedded defect comprising a method for creating a latent image of a periodic structure of claim 9 followed by chemical development process where portions of the resists are selectively dissolved depending on their exposure.

13. A method for creating periodic structure with embedded defect in a material comprising a method for creating periodic structure with embedded defect of claim 12 followed by backfilling the voids with said material.

14. A method of claim 13 followed by removing said resist.

* * * * *